United States Patent
Yang

(10) Patent No.: US 8,773,155 B2
(45) Date of Patent: Jul. 8, 2014

(54) MUT FOR TESTING MEMORY MODULES

(75) Inventor: Yung-Ching Yang, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 229 days.

(21) Appl. No.: 13/182,451

(22) Filed: Jul. 14, 2011

(65) Prior Publication Data

US 2013/0015874 A1    Jan. 17, 2013

(51) Int. Cl.
- *G06F 11/00* (2006.01)
- *H05K 7/14* (2006.01)
- *H05K 1/14* (2006.01)
- *G11C 29/56* (2006.01)

(52) U.S. Cl.
CPC ........ *G11C 29/56016* (2013.01); *H05K 7/1461* (2013.01); *H05K 1/148* (2013.01); *H05K 7/1444* (2013.01)
USPC ............................. 324/756.02; 714/25; 714/42

(58) Field of Classification Search
CPC ............. G11C 29/56016; H05K 1/148; H05K 7/1461; H05K 7/1444
USPC .................................. 324/756.02; 714/25, 42
See application file for complete search history.

(56) References Cited

U.S. PATENT DOCUMENTS

| | | | | |
|---|---|---|---|---|
| 4,725,250 A * | 2/1988 | Kuhn et al. | ................... | 439/629 |
| 5,112,242 A * | 5/1992 | Choy et al. | ................... | 439/326 |
| 7,509,532 B2* | 3/2009 | Co et al. | .......................... | 714/25 |
| 2002/0131249 A1* | 9/2002 | Frederick et al. | ............. | 361/752 |
| 2006/0114661 A1* | 6/2006 | Haba | ............................. | 361/749 |

* cited by examiner

*Primary Examiner* — Jermele M Hollington
*Assistant Examiner* — Farhana Hoque
(74) *Attorney, Agent, or Firm* — Winston Hsu; Scott Margo

(57) ABSTRACT

An MUT unit for testing memory modules includes a first circuit board; a second circuit board coupled to the first circuit board in a vertical orientation; a socket on a top surface of the first circuit board; and a resilient member electrically connecting the first and second circuit boards at an joint there between, wherein the resilient member comprises a horizontal segment that is welded to a bottom surface of the first circuit board, a vertical segment that is welded to a surface of the second circuit board, and a curved buffer segment connecting the horizontal segment and the vertical segment.

7 Claims, 3 Drawing Sheets

MUT FOR TESTING MEMORY MODULES

BACKGROUND OF THE INVENTION

1. Field of the Invention

The present invention relates generally to the field of memory module testing, and more particularly, to an improved MUT (module-under-test) or MUT unit for testing memory modules.

2. Description of the Prior Art

As known in the art, a memory module test system or a memory module tester is commonly used for testing and detecting assembly errors on the memory modules. Typically, a memory module tester may comprise handlers that are able to automatically insert memory modules into sockets on the MUT units. The tested memory modules are then sorted into a "bin" for modules that have passed or failed the test. In the high-volume production environment where time is of the essence, the automatic memory-module handler saves labor and streamlines the manufacturing process.

However, the prior art memory module tester still has some drawbacks. FIG. 1 is a schematic, cross-sectional diagram showing an MUT 10 in accordance with the prior art. As shown in FIG. 1, the MUT 10 may comprise two printed circuit boards (PCBs) 20a and 20b, which are vertically oriented with respect to each other, and a plurality of L-shaped pins 12 for electrically connected the PCBs 20a and 20b. A handler (not shown) inserts a memory module 40 into a socket 30 mounted on a top surface of the PCB 20a. It has been found by the inventor that the L-shaped pins 12 are liable to become detached from one of the printed circuit boards (PCBs) 20a/20b at the welding point over a period of time, thereby causing poor contact and decreased yield of the testing.

SUMMARY OF THE INVENTION

It is one objective of the present invention to provide an improved MUT unit for testing memory modules in order to solve the above-mentioned prior art problems and shortcomings.

According to the embodiments of the invention, an MUT unit for testing memory modules is provided. The MUT unit includes a first circuit board; a second circuit board coupled to the first circuit board in a vertical orientation; a socket on a top surface of the first circuit board; and a resilient member electrically connecting the first and second circuit boards at an joint there between, wherein the resilient member comprises a horizontal segment that is welded to a bottom surface of the first circuit board, a vertical segment that is welded to a surface of the second circuit board, and a curved buffer segment connecting the horizontal segment and the vertical segment.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
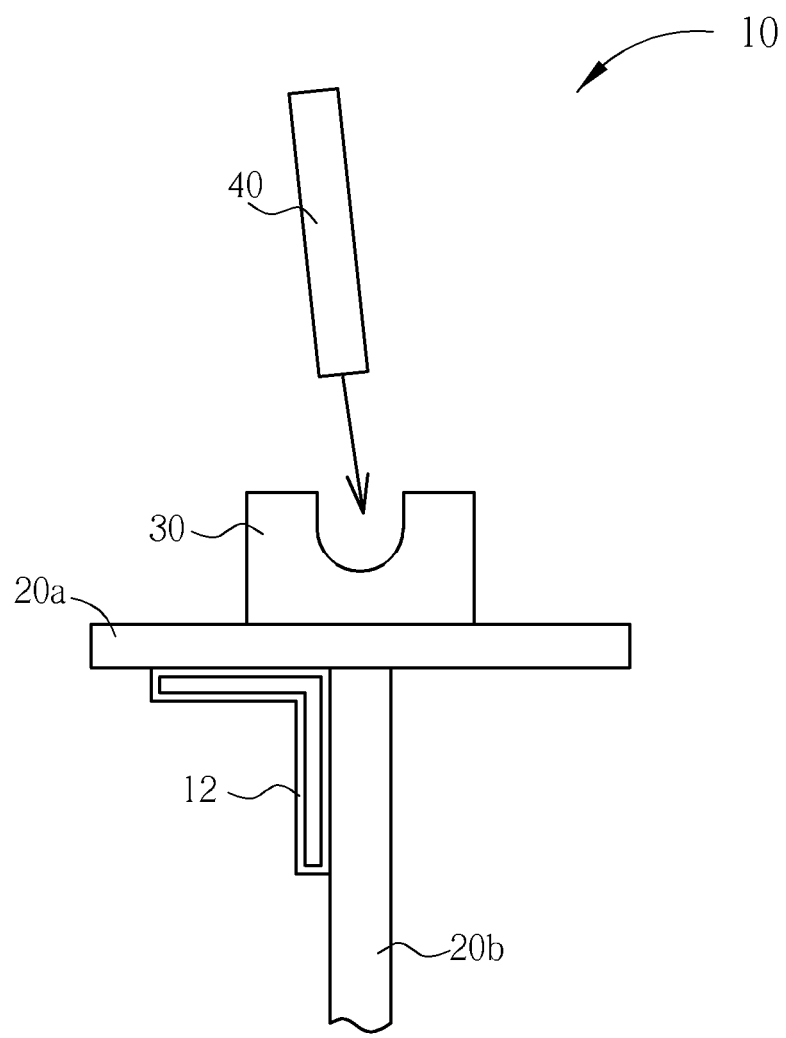
FIG. 1 is a schematic, cross-sectional diagram showing an MUT in accordance with the prior art.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings, which form a part hereof, and in which is shown by way of illustration specific examples in which the embodiments may be practiced. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

The term "horizontal" as used herein is defined as a plane substantially parallel to the ground or the conventional major plane or surface of a tester. The term "vertical" refers to a direction perpendicular to the horizontal as just defined. Terms, such as "on", "above", "below", "bottom", "top", "side" (as in "sidewall"), "higher", "lower", "over", and "under", if used, are defined with respect to the horizontal plane.

As previously mentioned, a conventional MUT comprises two printed circuit boards, which are vertically oriented with respect to each other, and a plurality of L-shaped pins for electrically connected the two PCBs. The L-shaped pins are welded at the joint between the two abutted PCBs, leaving substantially no gap between each of the L-shaped pins and the PCBs. The inventor has found that the L-shaped pins are liable to become detached from one of the PCBs of an MUT at the welding point after a period of use, thereby causing poor contact and decreased yield of the testing. The present invention addresses this issue.

Figure 2:
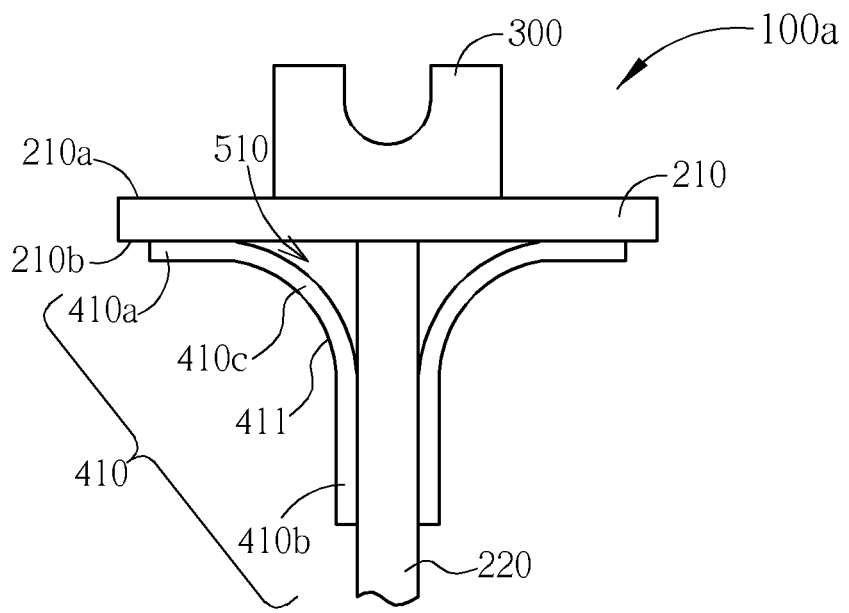
FIG. 2 is a schematic, cross-sectional diagram showing an improved MUT unit for testing memory modules in accordance with one embodiment of this invention.

Please refer to FIG. 2. FIG. 2 is a schematic, cross-sectional diagram showing an improved MUT (module-under-test) or MUT unit for testing memory modules in accordance with one embodiment of this invention. As shown in FIG. 2, the MUT unit 100a comprises a first circuit board 210 and a second circuit board 220 coupled to the first circuit board 210. The first circuit board 210 is a strip-like circuit board and has a horizontal top surface 210a and a bottom surface 210b opposite to the top surface 210a. Typically, the second circuit board 220 is vertically fastened to the bottom surface 210b of the first circuit board 210. A socket 300 is assembled on the top surface 210a of the first circuit board 210. During testing, a handler (not shown) inserts a memory module or card into the socket 300 in a vertical direction that is substantially perpendicular to the top surface 210a.

During testing, mechanical stress may be exerted on the top surface 210a of the first circuit board 210 due to angle deviation when the handler (not shown) inserts the memory module into the socket 300. To resist the stress and torsion during testing, a resilient member 410 is employed to electrically connect the two abutted circuit boards 210 and 220 at the joint. The resilient member 410 is made of conductive, non-forge-welding materials such as copper or copper alloys, which is monolithic and is structurally strong. According to the embodiment of the invention, the resilient member 410 comprises a horizontal segment 410a that is welded to the bottom surface 210b of the first circuit board 210, a vertical segment 410b that is welded to a surface of the second circuit board 220, and a curved buffer segment 410c connecting the horizontal segment 410a and the vertical segment 410b. According to the embodiment of the invention, the curved buffer segment 410c has a concave outer surface 411 to thereby form a gap 510 between the resilient member 410 and the two abutted circuit boards 210 and 220.

Figure 3:
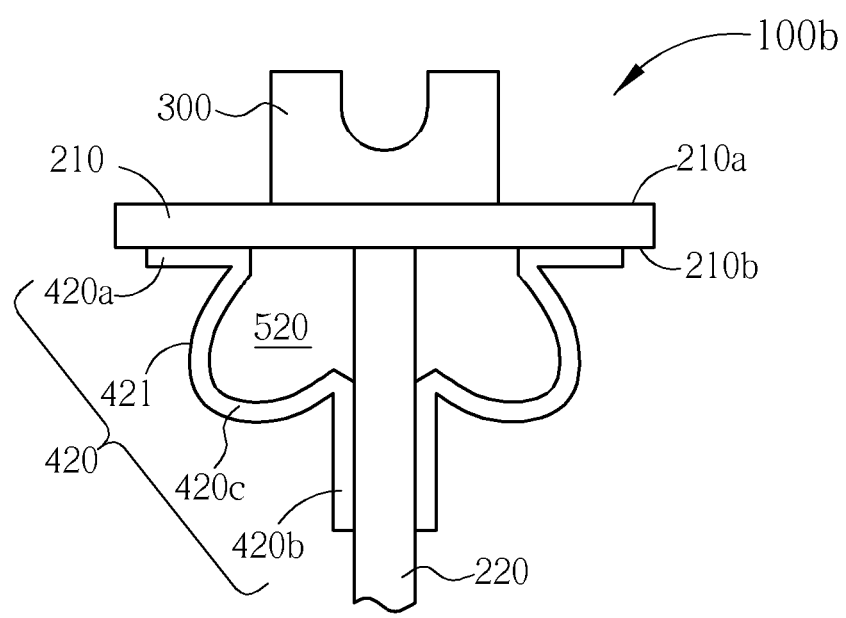
FIG. 3 is a schematic, cross-sectional diagram showing an improved MUT unit for testing memory modules in accordance with another embodiment of this invention.

FIG. 3 is a schematic, cross-sectional diagram showing an improved MUT unit for testing memory modules in accordance with another embodiment of this invention, wherein like numeral numbers designate like elements, parts or layers. As shown in FIG. 3, likewise, the MUT unit 100b comprises a first circuit board 210 and a second circuit board 220 coupled to the first circuit board 210. The first circuit board 210 is a strip-like circuit board and has a horizontal top surface 210a and a bottom surface 210b opposite to the top surface 210a. Typically, the second circuit board 220 is vertically fastened to the bottom surface 210b of the first circuit board 210. A socket 300 is assembled on the top surface 210a of the first circuit board 210. During testing, a handler (not shown) inserts a memory module or card into the socket 300 in a vertical direction that is substantially perpendicular to the top surface 210a.

During testing, mechanical stress may be exerted on the top surface 210a of the first circuit board 210 due to angle deviation when the handler (not shown) inserts the memory module into the socket 300. To resist the stress and torsion during testing, a resilient member 420 is employed to electrically connect the two abutted circuit boards 210 and 220 at the joint. The resilient member 420 is made of conductive, non-forge-welding materials such as copper or copper alloys, which is monolithic and is structurally strong. According to the embodiment of the invention, the resilient member 420 comprises a horizontal segment 420a that is welded to the bottom surface 210b of the first circuit board 210, a vertical segment 420b that is welded to a surface of the second circuit board 220, and a curved buffer segment 420c connecting the horizontal segment 420a and the vertical segment 420b. According to the embodiment of the invention, the curved buffer segment 420c has a convex outer surface 421 to thereby form a pocket-like gap 520 between the resilient member 420 and the two abutted circuit boards 210 and 220.

Figure 4:
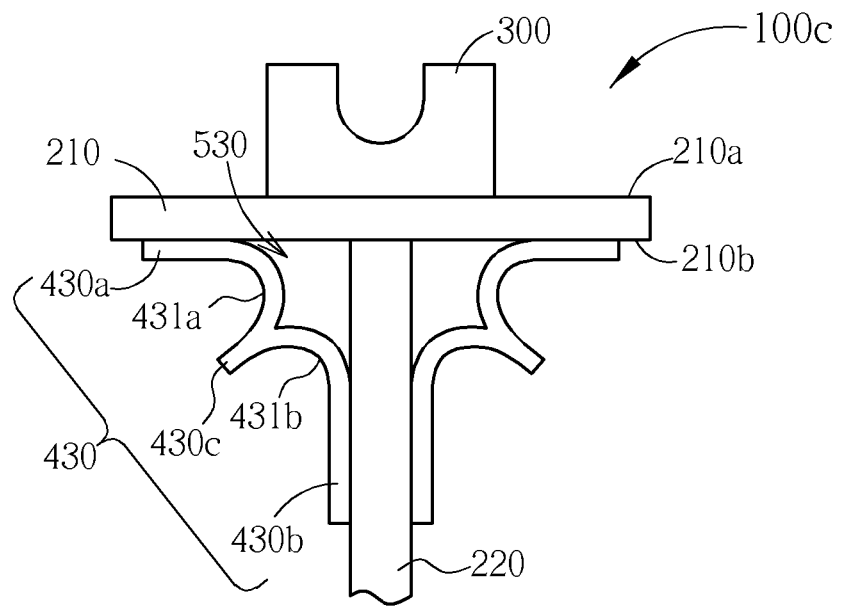
FIG. 4 is a schematic, cross-sectional diagram showing an improved MUT unit for testing memory modules in accordance with still another embodiment of this invention.

FIG. 4 is a schematic, cross-sectional diagram showing an improved MUT unit for testing memory modules in accordance with still another embodiment of this invention, wherein like numeral numbers designate like elements, parts or layers. As shown in FIG. 4, likewise, the MUT unit 100c comprises a first circuit board 210 and a second circuit board 220 coupled to the first circuit board 210. The first circuit board 210 is a strip-like circuit board and has a horizontal top surface 210a and a bottom surface 210b opposite to the top surface 210a. Typically, the second circuit board 220 is vertically fastened to the bottom surface 210b of the first circuit board 210. A socket 300 is assembled on the top surface 210a of the first circuit board 210. During testing, a handler (not shown) inserts a memory module or card into the socket 300 in a vertical direction that is substantially perpendicular to the top surface 210a.

During testing, mechanical stress may be exerted on the top surface 210a of the first circuit board 210 due to angle deviation when the handler (not shown) inserts the memory module into the socket 300. To resist the stress and torsion during testing, a resilient member 430 is employed to electrically connect the two abutted circuit boards 210 and 220 at the joint. The resilient member 430 is made of conductive, non-forge-welding materials such as copper or copper alloys, which is monolithic and is structurally strong. According to the embodiment of the invention, the resilient member 430 comprises a horizontal segment 430a that is welded to the bottom surface 210b of the first circuit board 210, a vertical segment 430b that is welded to a surface of the second circuit board 220, and a curved buffer segment 430c connecting the horizontal segment 430a and the vertical segment 430b. According to the embodiment of the invention, the curved buffer segment 430c has two continuous concave outer surface 431a and 431b to thereby form a gap 530 between the resilient member 430 and the two abutted circuit boards 210 and 220.

Figure 5:
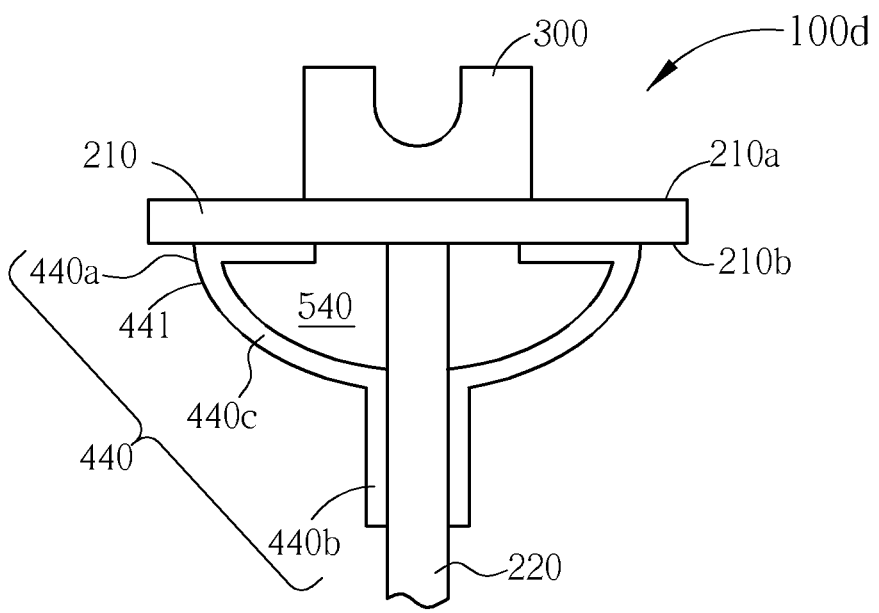
FIG. 5 is a schematic, cross-sectional diagram showing an improved MUT unit for testing memory modules in accordance with yet another embodiment of this invention.

FIG. 5 is a schematic, cross-sectional diagram showing an improved MUT unit for testing memory modules in accordance with yet another embodiment of this invention, wherein like numeral numbers designate like elements, parts or layers. As shown in FIG. 5, likewise, the MUT unit 100d comprises a first circuit board 210 and a second circuit board 220 coupled to the first circuit board 210. The first circuit board 210 is a strip-like circuit board and has a horizontal top surface 210a and a bottom surface 210b opposite to the top surface 210a. Typically, the second circuit board 220 is vertically fastened to the bottom surface 210b of the first circuit board 210. A socket 300 is assembled on the top surface 210a of the first circuit board 210. During testing, a handler (not shown) inserts a memory module or card into the socket 300 in a vertical direction that is substantially perpendicular to the top surface 210a.

During testing, mechanical stress may be exerted on the top surface 210a of the first circuit board 210 due to angle deviation when the handler (not shown) inserts the memory module into the socket 300. To resist the stress and torsion during testing, a resilient member 440 is employed to electrically connect the two abutted circuit boards 210 and 220 at the joint. The resilient member 440 is made of conductive, non-forge-welding materials such as copper or copper alloys, which is monolithic and is structurally strong. According to the embodiment of the invention, the resilient member 440 comprises a horizontal segment 440a that is welded to the bottom surface 210b of the first circuit board 210, a vertical segment 440b that is welded to a surface of the second circuit board 220, and a curved buffer segment 440c connecting the horizontal segment 440a and the vertical segment 440b. According to the embodiment of the invention, the curved buffer segment 440c has a convex outer surface 441 to thereby form a gap 540 between the resilient member 440 and the two abutted circuit boards 210 and 220. The difference between the resilient member 420 in FIG. 3 and the resilient member 440 in FIG. 5 is that the curved buffer segment 440c of the resilient member 440 in FIG. 5 is directly connected to an outer distal end of the horizontal segment 440a.

Those skilled in the art will readily observe that numerous modifications and alterations of the device and method may be made while retaining the teachings of the invention.

What is claimed is:

1. An MUT unit for testing memory modules, comprising:
a first circuit board;
a second circuit board coupled to the first circuit board in a vertical orientation, wherein the second circuit board is in direct contact with a bottom surface of the first circuit board;
a socket on a top surface of the first circuit board;
a resilient member electrically connecting the first and second circuit boards at an joint therebetween, wherein the resilient member comprises a horizontal segment that is welded to a bottom surface of the first circuit board, a vertical segment that is welded to a surface of the second circuit board, and a curved buffer segment connecting the horizontal segment and the vertical segment; and
a confined gap disposed between an inner surface of the curved buffer segment, the bottom surface of the first circuit board, and the surface of the second circuit board.

2. The MUT unit for testing memory modules according to claim 1 wherein the curved buffer segment has a concave outer surface.

3. The MUT unit for testing memory modules according to claim 1 wherein the curved buffer segment has a convex outer surface.

4. The MUT unit for testing memory modules according to claim 1 wherein a gap is formed between the resilient member, the first and second circuit boards.

5. The MUT unit for testing memory modules according to claim 1 wherein the resilient member is made of conductive, non-forge-welding materials.

6. The MUT unit for testing memory modules according to claim 5 wherein the resilient member comprises copper or copper alloys.

7. The MUT unit for testing memory modules according to claim 5 wherein the resilient member is monolithic.

* * * * *